United States Patent
Blake et al.

(10) Patent No.: US 8,560,891 B2
(45) Date of Patent: *Oct. 15, 2013

(54) EDRAM MACRO DISABLEMENT IN CACHE MEMORY

(71) Applicant: International Business Machines Corporation, Armonk, NY (US)

(72) Inventors: Michael A. Blake, Wappingers Falls, NY (US); Timothy C. Bronson, Round Rock, TX (US); Hieu T. Huynh, Pflugerville, TX (US); Pak-kin Mak, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/655,088

(22) Filed: Oct. 18, 2012

(65) Prior Publication Data
US 2013/0042144 A1 Feb. 14, 2013

Related U.S. Application Data

(63) Continuation of application No. 12/822,367, filed on Jun. 24, 2010.

(51) Int. Cl.
*G06F 11/00* (2006.01)
(52) U.S. Cl.
USPC .............. 714/30; 714/6.1; 714/6.11; 714/36; 714/733
(58) Field of Classification Search
USPC .................. 714/6.1, 30, 6.11, 36, 733
See application file for complete search history.

(56) References Cited

U.S. PATENT DOCUMENTS

| | | | |
|---|---|---|---|
| 4,601,012 A | 7/1986 | Aiken, Jr. | |
| 5,568,629 A | 10/1996 | Gentry et al. | |
| 5,961,653 A * | 10/1999 | Kalter et al. | 714/6.32 |
| 5,986,952 A * | 11/1999 | McConnell et al. | 365/200 |
| 6,052,798 A * | 4/2000 | Jeddeloh | 714/6.13 |
| 6,148,374 A | 11/2000 | Pawlowski | |
| 6,388,930 B1 * | 5/2002 | Obremski | 365/201 |
| 6,400,619 B1 * | 6/2002 | Hsu et al. | 365/200 |
| 6,445,626 B1 * | 9/2002 | Hsu et al. | 365/200 |
| 6,542,973 B2 * | 4/2003 | Hsu et al. | 711/154 |
| 6,622,218 B2 | 9/2003 | Gharachorloo et al. | |
| 6,631,456 B2 | 10/2003 | Leighnor et al. | |

(Continued)

OTHER PUBLICATIONS

Albonesi, D.H., An Architectural and circuit-level approach to improving the energy efficiency of microprocessor Memory structures, In Proc. the 10th Annual Conference on VLSI, 1999, pp. 192-205, INPROCEEDINGS.

*Primary Examiner* — Loan L. T. Truong
(74) *Attorney, Agent, or Firm* — Cantor Colburn LLP; John Campbell

(57) ABSTRACT

A computer implemented method of embedded dynamic random access memory (EDRAM) macro disablement. The method includes isolating an EDRAM macro of a cache memory bank, the cache memory bank being divided into at least three rows of a plurality of EDRAM macros, the EDRAM macro being associated with one of the at least three rows. Each line of the EDRAM macro is iteratively tested, the testing including attempting at least one write operation at each line of the EDRAM macro. It is determined that an error occurred during the testing. Write perations for an entire row of EDRAM macros associated with the EDRAM macro are disabled based on the determining.

6 Claims, 7 Drawing Sheets

(56) References Cited

U.S. PATENT DOCUMENTS

| | | |
|---|---|---|
| 6,687,790 B2 | 2/2004 | Zager et al. |
| 6,924,663 B2 | 8/2005 | Masui et al. |
| 6,957,299 B2 | 10/2005 | Villaret et al. |
| 7,073,100 B2* | 7/2006 | Chadwick et al. ............ 714/718 |
| 7,159,145 B2* | 1/2007 | Wang et al. .................... 714/36 |
| 7,237,165 B2* | 6/2007 | Chadwick et al. ............ 714/733 |
| 7,366,946 B2* | 4/2008 | Derner et al. ................. 714/6.2 |
| 7,370,251 B2* | 5/2008 | Nadeau-Dostie et al. .... 714/723 |
| 7,444,575 B2* | 10/2008 | Ong ............................. 714/742 |
| 7,856,577 B2* | 12/2010 | Andreev et al. ................ 714/42 |
| 2003/0009615 A1 | 1/2003 | Hsu et al. |
| 2003/0043663 A1* | 3/2003 | Haraguchi et al. ............ 365/201 |
| 2003/0123278 A1 | 7/2003 | Anand et al. |
| 2003/0212933 A1 | 11/2003 | Antonischki |
| 2004/0103356 A1* | 5/2004 | Boehler ........................ 714/733 |
| 2007/0047343 A1* | 3/2007 | Adams et al. ................. 365/200 |
| 2008/0276144 A1 | 11/2008 | Huben et al. |
| 2009/0144504 A1 | 6/2009 | Barth, Jr. et al. |
| 2009/0158092 A1 | 6/2009 | Anand et al. |
| 2010/0182859 A1 | 7/2010 | Kohler et al. |
| 2011/0080208 A1* | 4/2011 | Sanavage et al. ............. 327/518 |
| 2011/0289349 A1* | 11/2011 | Loeser et al. ................ 714/6.24 |
| 2011/0320862 A1* | 12/2011 | Blake et al. .................... 714/6.1 |

* cited by examiner

EDRAM MACRO DISABLEMENT IN CACHE MEMORY

CROSS-REFERENCE TO RELATED APPLICATION

This application is a continuation of U.S. patent application Ser. No. 12/822,367, filed Jun. 24, 2010, the content of which is hereby incorporated by reference in its entirety.

BACKGROUND

This invention generally relates to cache memory, and in particular, to embedded dynamic access memory (EDRAM) macro disablement in cache memory.

Conventionally, redundancies in EDRAM macros and EDRAM macro sparing may be employed to circumvent a limited number of defects within a cache memory. The redundancies may be formed as spare portions within the cache memory which may be accessed through arranged circuitry. Thus, if portions of a cache memory are defective, particularly within an EDRAM macro, a portion of the redundancies may be utilized to replace the defective portions. However, if the available spare portions for the cache memory are all utilized and subsequent defects exist, the cache memory cannot be used and must be discarded.

In relatively large cache memories, EDRAM macro sparing and redundancies are not practical. For example, a large cache memory may include a plurality of data paths and multiple address sliced cache banks. In order to include an acceptable number of redundancies for EDRAM macros, the arranged circuitry for redundancy activation would require much more space than may be available on large cache memory chips, in addition to causing increased difficulties in design, fabrication, and control resulting from the heavily populated circuitry associated with the redundancies.

SUMMARY

An embodiment includes a computer implemented method of embedded dynamic random access memory (EDRAM) macro disablement. The method includes isolating an EDRAM macro of a cache memory bank, the cache memory bank being divided into at least three rows of a plurality of EDRAM macros, the EDRAM macro being associated with one of the at least three rows. Each line of the EDRAM macro is iteratively tested, the testing including attempting at least one write operation at each line of the EDRAM macro. It is determined that an error occurred during the testing. Write perations for an entire row of EDRAM macros associated with the EDRAM macro are disabled based on the determining.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

An example embodiment of the present invention provides a novel mechanism for EDRAM macro disablement. If a cache memory chip includes errors or defects, example embodiments disable the defective portions of EDRAM of the cache memory chip to circumvent the defects. Disablement may be provided through enhanced least recently used (LRU) selection logic such that operation of the cache memory is relatively unaffected even with defective EDRAM disabled.

Technical effects and benefits of example embodiments of the present invention include disablement of portions of a cache memory while retaining an acceptable level of available cache memory capacity, thereby reducing the number of redundancies necessary to circumvent defects in the cache memory.

Figure 1:
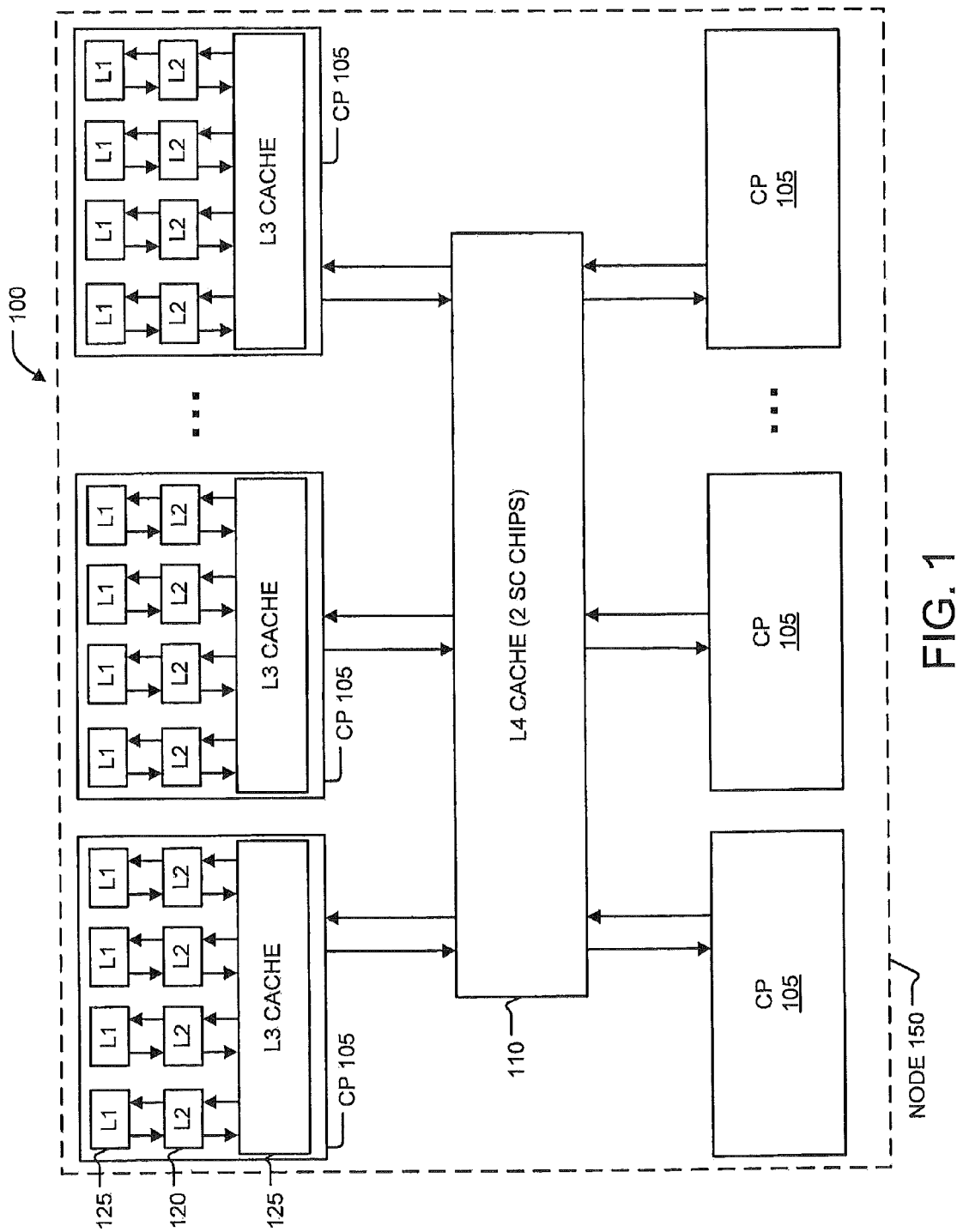
FIG. 1 depicts a state of the art cache topology.

FIG. 1 illustrates a state of the art cache topology 100. FIG. 1 illustrates a plurality of central processors (CP) 105 (e.g., central processing units) operatively connected via busses to one or more L4 caches 110. Although not shown in FIG. 1, each of the central processors 105 includes one or more cores which may perform reading and executing of instructions. On each central processor 105, the multiple cores may be operatively connected via busses to the L1, L2, and L3 caches 125, 120, and 115. The L1 caches 125 are physically closest to the cores, with the L2 caches 120 and the L3 caches 115 successively further from the cores. It is understood that the designation of caches may be reversed. Although the L3 and L4 caches 115 and 110 may comprise embedded dynamic random access memory (DRAM) which is referred to herein as EDRAM, it should be understood that any other type of suitable memory, such as DRAM, may be utilized. The plurality of central processors 105 operatively connected to the L4 caches 110 (e.g., two L4 caches) form a node 150. In a computing system, a plurality of nodes 150 may be operatively connected to one another for communications such as making and responding to requests, or any suitable operation.

Each individual central processor 105 may be fabricated on a separate chip, which may include the L1, L2, and L3 caches 125, 120, and 115. The L4 cache 110 may be fabricated on a separate chip, or a combination of separate chips. According to example embodiments of the present invention, the L4 cache 110 is formed on two (2) separate chips. Fabrication of the chips (including integrated circuits, wires, metal layers, semiconductor and/or other material components) may be facilitated through lithography and/or other suitable techniques. The fabrication process may include various deposition techniques including physical vapor deposition (PVD), chemical vapor deposition (CVD), electrochemical deposition (ECD), molecular beam epitaxy (MBE), atomic layer deposition (ALD) and/or any suitable technique.

Figure 2:
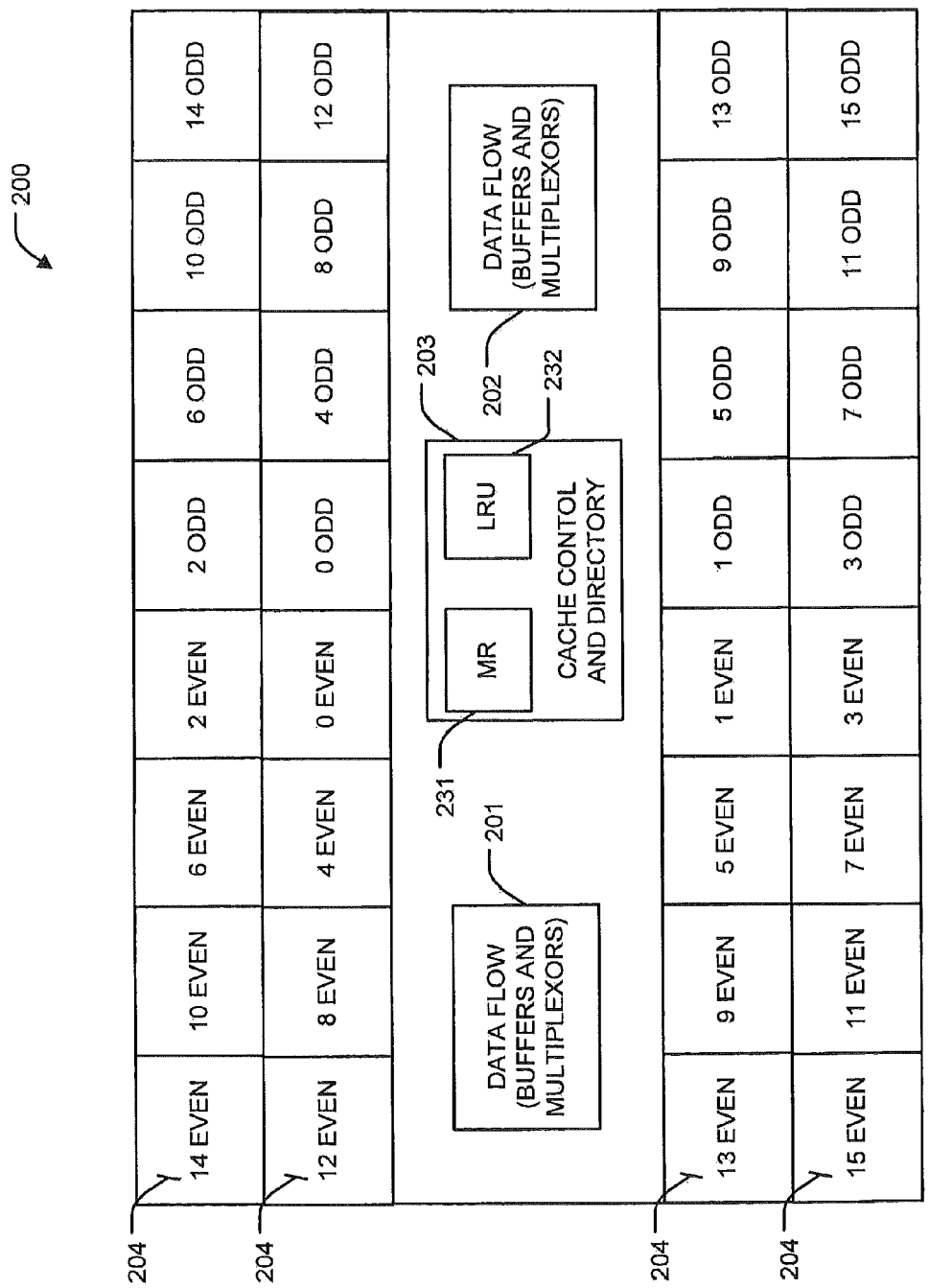
FIG. 2 depicts a logical layout of a single cache chip.

Turning to FIG. 2, a logical layout of a single cache chip is illustrated. For example, the cache may be a L4 cache. It should be understood that according to at least one example embodiment, an entire cache is divided amongst two chips, and therefore, a complete example cache would include two chips 200. A complete example cache may be twenty-four (24) way set associative, comprised of one thousand five hundred thirty-six (1536) EDRAM macros on the two chips.

Thus, each chip may include seven hundred sixty-eight EDRAM macros. The complete example cache may be address sliced into thirty-two (32) banks, further separated into three groups of eight-way associative macros thereby achieving twenty-four way set associativity. Each chip may include half of the complete example cache banks, or sixteen banks. Each bank may include forty-eight EDRAM macros divided into three groups of sixteen. Therefore, for one chip of a complete example cache, there should be twenty-four associativity classes and 16 k congruence classes, with each cache bank including 1 k of the congruence classes and twenty-four associativity classes.

Turning back to FIG. 2, a single chip 200 may include sixteen cache banks, divided into EVEN and ODD sections, labeled 0-15 EVEN/ODD. Therefore each chip 200 may include half of the total thirty-two cache banks of a complete example cache.

The chip 200 may also include data flow portions 201 and 202. The data flow portions 201 and 202 may include buffers and multiplexors (not illustrated for the sake of clarity) to facilitate data flow across the chip 200.

The chip 200 may further include a cache control and directory 203. The cache control and directory 203 provides control of cache reads/writes. The cache control and directory 203 includes a cache array mask register 231 and LRU selection logic 232.

The cache array mask register 231 may provide a logical mask to the LRU selection logic 232, the logical mask configured to identify a particular set of EDRAMS to disable.

The LRU selection logic 232 is configured to select an associativity class in which a new cache line is to be installed/written. Through comparison of the logical mask and a bank address, the LRU selection logic 232 may disable write operations to the particular set of EDRAM macros identified in the logical mask. Detailed description of EDRAM macro disablement is provided below with reference to FIGS. 3-4.

Figure 3:
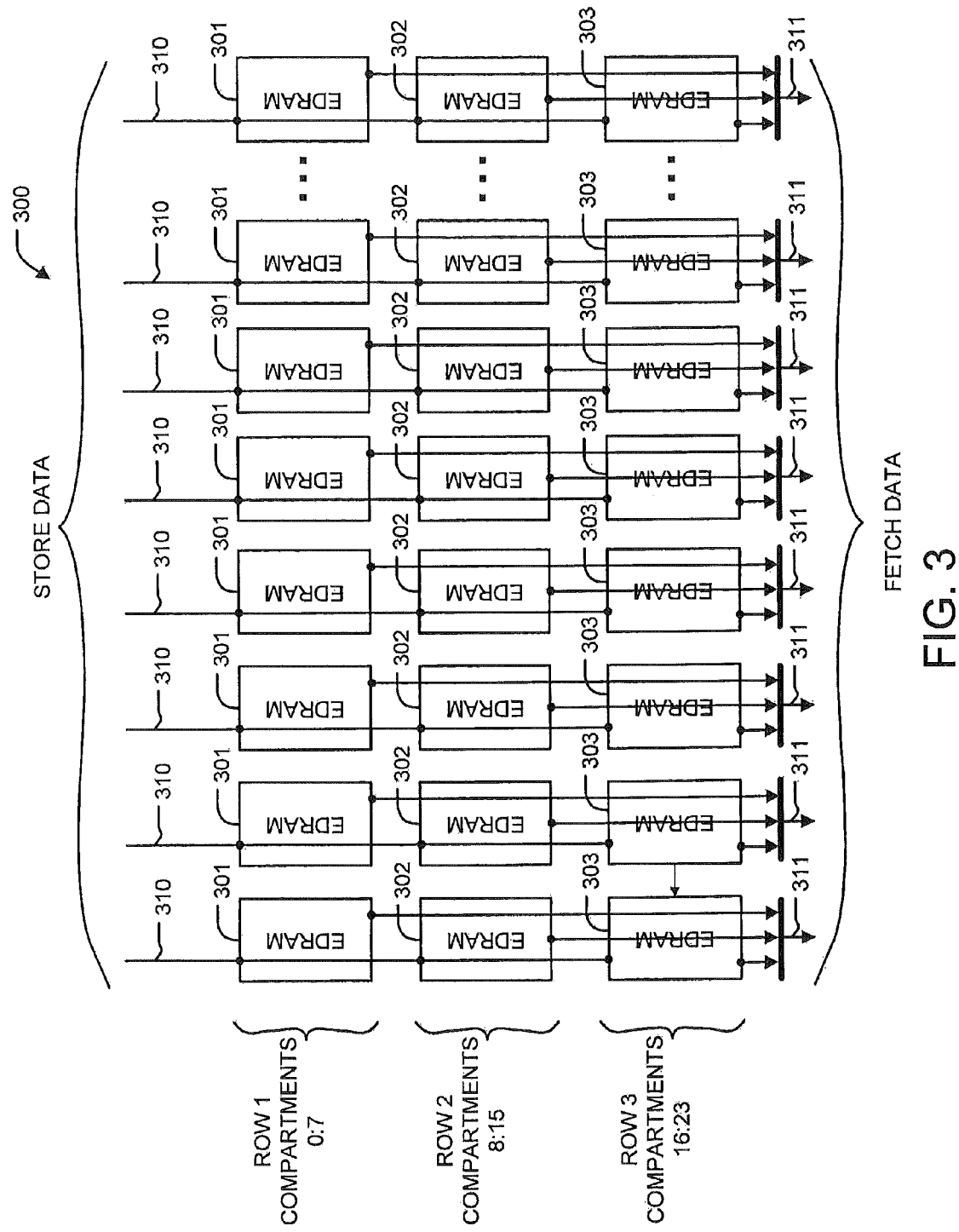
FIG. 3 depicts a logical view of a single cache bank.

FIG. 3 depicts a logical view of a single L4 cache bank. The cache bank 300 includes a plurality of EDRAM macros 301-303. As described above, according to some example embodiments, a cache bank may include forty-eight EDRAM macros. The plurality of EDRAM macros 301-303 are divided into twenty-four (24) compartments arranged in three rows, labeled ROW 1, ROW 2, and ROW 3. ROW 1 includes the plurality of EDRAM macros 301, and provides eight compartments 0 through 7. ROW 2 includes the plurality of EDRAM macros 302, and provides eight compartments 8 through 15. ROW 3 includes the plurality of EDRAM macros 303, and provides eight compartments 16 through 23. Each EDRAM macro and consequently each ROW contains 1024 lines, addressable via 10 line address bits (not shown for clarity).

The cache bank 300 receives store data over a plurality of communication buses 310. The store data is stored in associated EDRAMS depending upon an associated compartment and line addresses. The cache bank 300 transfers fetched data over a plurality of communication buses 311. Each communication bus of the plurality of communication buses 310-311 may be a 16 byte wide communication bus comprised of individual 9-bit wide communication buses. Therefore, the cache bank 400 provides 1 k of the 16 k congruence classes of a single cache memory chip (e.g., 200).

According to example embodiments, in order for an EDRAM to be disabled, it is beneficial to take into consideration the organization of the cache memory system. For example, as each cache bank includes three rows of eight-way set associative macros, one or two of the rows may be disabled entirely while still maintaining operability of the entire cache. If one row is disabled, defective EDRAM macro(s) of the row may be avoided while releasing only one percent (e.g., 1/(32*3)) of an entire example cache's capacity.

According to example embodiments, the cache bank 300 may have any one of ROW 1, ROW 2, or ROW 3 disabled using a logical mask. The logical mask may be provided to LRU selection logic of a cache memory chip including the cache bank 300. If a row (e.g., compartment set) is disabled, another row is used for line installs. For example, as a complete example cache may be twenty-four way set associative, and each row may include eight associativity classes, if any one row is disabled, sixteen associativity class remain for line installs. Furthermore, two of the three rows may be disabled, leaving only one row for line installs. However, it follows that if all three rows are disabled, there would be no associativity classes remaining, resulting in an unusable cache memory chip.

Hereinafter, a more detailed description of EDRAM macro disablement through cache selection is provided.

Figure 4:
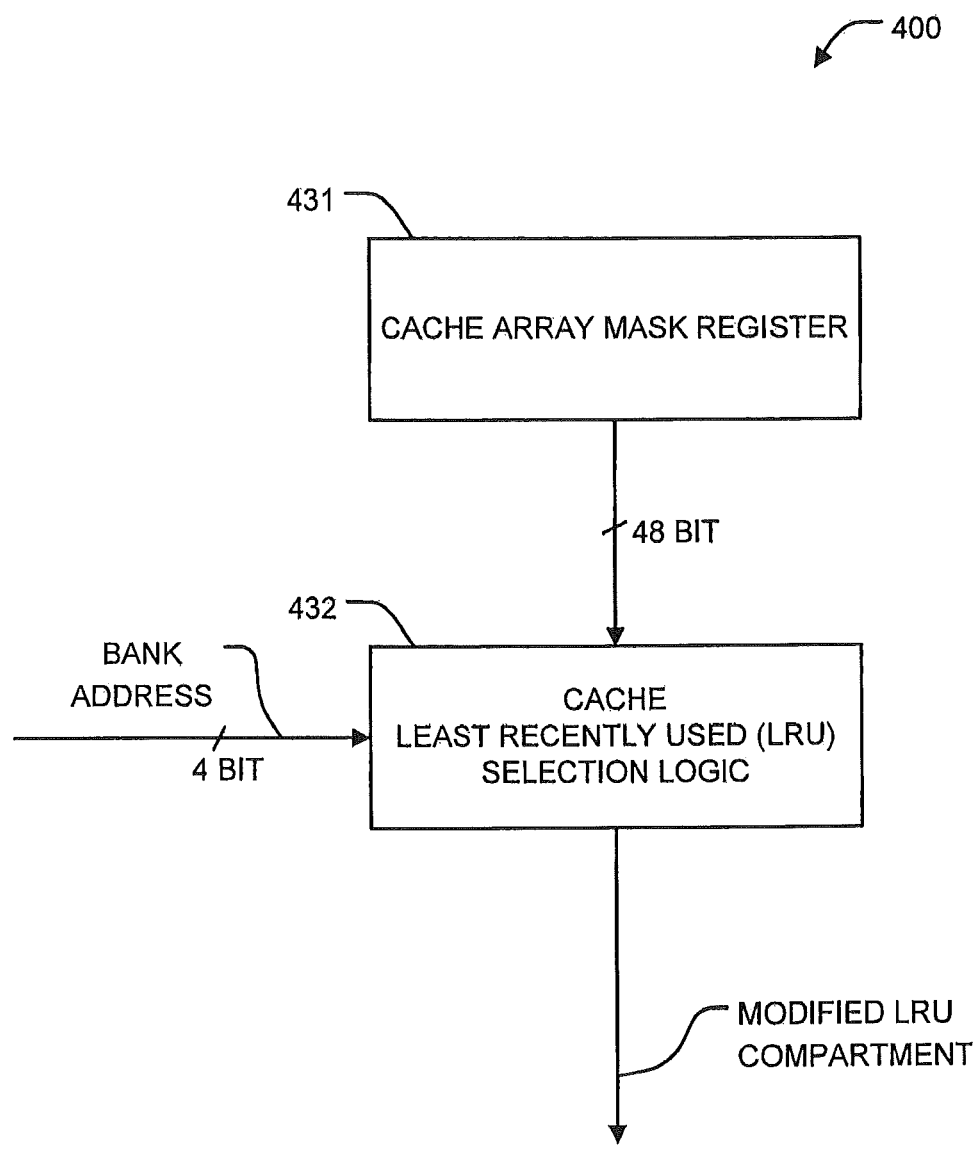
FIG. 4 depicts a cache selection system including EDRAM macro disablement.

FIG. 4 depicts a cache selection system including EDRAM macro disablement. The cache selection system 400 includes a cache array mask register 431. The cache array mask register 431 may be similar to the cache array mask register 231. The cache array mask register 431 may be configured to be programmable and to store forty-eight (48) bits corresponding to EDRAM macros within one cache bank. For example, each bit of the forty-eight bits may correspond to one row of EDRAM macros in one cache bank. The stored bits may be passed to cache least recently used (LRU) selection logic 432 as a logical mask. The logical mask may be configured to select one or more row of EDRAM macros for disablement through the LRU selection logic 432.

The LRU selection logic 432 may be similar to LRU selection logic 232. The LRU selection logic 432 may apply/interpret the logical mask and may disable one or more rows of EDRAM macros based on the interpretation. For example, if a bit of the logical mask is set to a logical "1", the row of EDRAM macros corresponding to that bit is disabled.

The corresponding row of EDRAM macros is disabled logically, rather than physically, through the LRU selection logic 432. For example, the LRU selection logic 432 encodes the logical mask provided by the cache array mask register 431 into a four-bit vector. This four-bit vector is compared to a four-bit bank address of a line to be installed/written. If the bank address matches a bank address containing an EDRAM macro row identified in the logical mask, a modified LRU selection address is output which does not include the identified EDRAM row. Therefore, as the row is only logically disabled through the LRU selection logic 432, there is no prevention of read operations from the disabled row, only install/write operations. In this manner, operation of cache memory is not affected, and data previously stored in the disabled row may be accessed until it is fully ejected.

Once all data is read, moved, or purged from the disabled row through normal operation of the cache memory, the disabled row may remain disabled in all cycles where a corresponding bit of the logical mask remains set to a logical "1". It follows that several rows of EDRAM macros may be disabled through implementation of several logical "1"s in the logical mask. Therefore, multiple bits of the cache array mask register may be set to circumvent multiple defects or to facilitate testing of the cache memory.

Hereinafter, methods of EDRAM macro disablement are described with reference to FIGS. 5-6.

Figure 5:
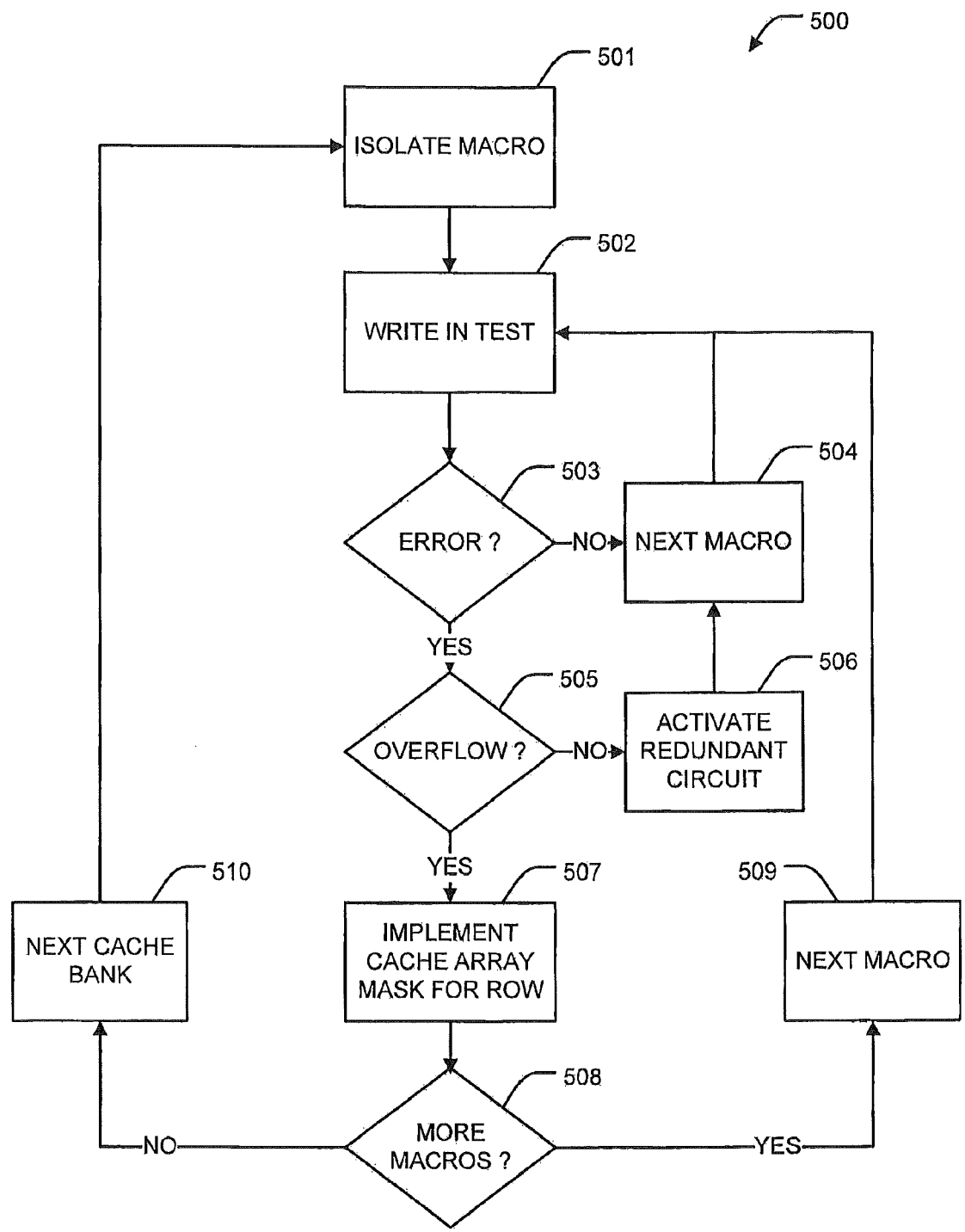
FIG. 5 depicts a method of EDRAM macro disablement.

FIG. 5 depicts a method of EDRAM macro disablement. The method 500 includes isolating an EDRAM macro of a cache memory bank at block 501. For example, the EDRAM macro may be an EDRAM macro of the cache memory bank. The EDRAM macro may be one of a plurality of EDRAM macros organized into one of three rows in the cache memory bank. Each of the three rows may represent a set of eight compartments or eight associativity classes, for a total of twenty-four associativity classes contained within the cache bank being tested.

Upon isolating the EDRAM macro, the method 500 includes testing EDRAM macro write in at block 502. For example, the EDRAM macro write in test may be an Array Built in Self-Test (ABIST) or other suitable test in which all lines are write in tested. The testing may include iterating through each line of an EDRAM macro to determine if there are defects within an EDRAM macro being tested. Defects may produce errors which may be handled as described below.

The method further includes determining if there is an error at block 503 (e.g., write in error). For example, an error may be an error which renders the currently tested EDRAM macro defective. If there is no error, the next EDRAM macro is selected at block 504, and testing resumes at block 502. If there is an error, the method 500 includes determining if there is an overflow at block 505.

According to the method 500, an overflow may be a situation where there are no redundancies for an EDRAM macro which may be arranged to perform for a defective portion or entirety of an EDRAM macro. If there is no overflow, the method 500 includes activating a redunancy or redundant circuit at block 506. Activating a redundancy may include arranging circuit paths to circumvent the defective portion of EDRAM macro. Thereafter, the next line or macro is selected at block 504, and testing resumes at block 502.

If there is an overflow, the method 500 includes implementing a cache array mask for the row corresponding to the defective EDRAM macro at block 507. For example, implementing the cache array mask may include setting a bit (e.g., to a logical "1") within a logical mask at a cache array mask register corresponding to a row in which the defective EDRAM macro is located. This bit in turn is passed within the logical mask to LRU selection logic within a cache memory control to render the corresponding row non-writable or un-pickable. For example, this may be logical disablement of the row containing the defective EDRAM macro as described above, while still allowing any information of the EDRAM macro to be read. As discussed above, the entire row is disabled, which disables eight of twenty-four associativity classes in the cache bank being tested.

Upon implementation of the cache array mask for the row, the method 500 includes determining if there are more EDRAM macros within the cache bank to be tested. If there are more EDRAM macros, the method 500 includes selecting the next available EDRAM macro at block 509, and continuing testing at block 502. If there are no more EDRAM macros in the cache bank, the method 500 includes selecting another cache bank to be tested at block 510, and the method 500 continues at EDRAM macro isolation of an EDRAM macro of a new cache bank at block 501.

Although not specifically described above, if all of the rows of a cache bank are disabled due to defective EDRAM macros, the cache bank may be useless. In this scenario testing may be halted to discard of the entire cache memory chip, or testing may continue to identify other manufacturing defects, which may be useful in future production.

Therefore, example embodiments of the present invention include methods of EDRAM macro disablement which include testing individual EDRAMS in an iterative manner. However, EDRAM macro disablement may also be practiced in a dynamic manner during actual system use of a cache memory.

Figure 6:
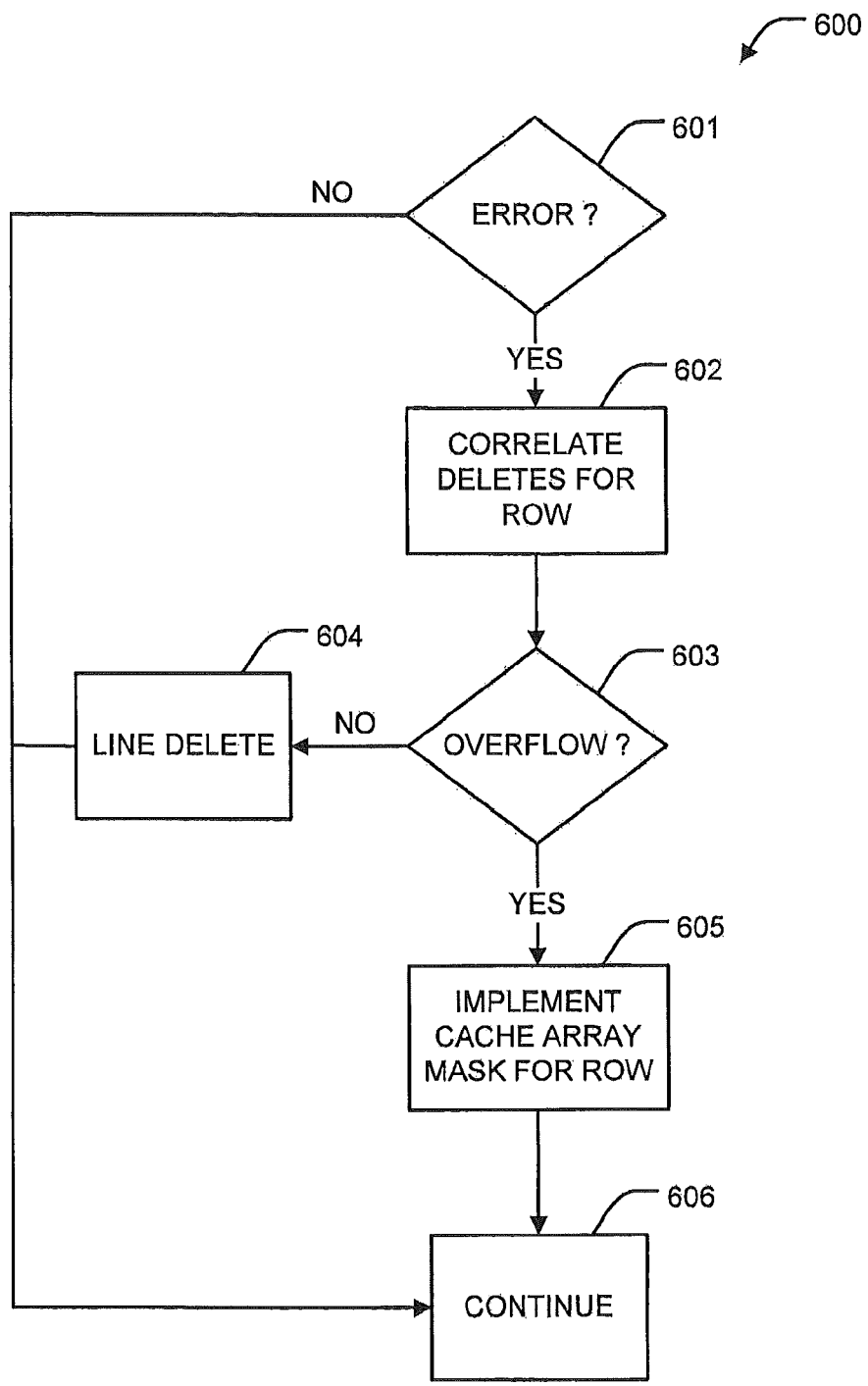
FIG. 6 depicts a dynamic method of EDRAM macro disablement.

FIG. 6 depicts a dynamic method of EDRAM macro disablement. The method 600 includes determining if an error has occurred, or alternatively catching an error, at block 601. For example, the error may be an error during the write in or read from an EDRAM macro. The error may be caught through a cache memory control configured to determine if an error has occurred. If an error is caught, the method 600 may include correlating line deletes and/or errors across an entire row associated with the error. For example, the error may originate from an EDRAM macro. The EDRAM macro may be allocated to one of three rows of a cache memory bank. As errors from multiple different EDRAM macros of the same row are caught, the cache control may issue a line delete and re-attempt the write which caused the error. Each instance of a line delete may be stored for correlation at block 602. Therefore, if an EDRAM macro causes multiple errors, this information is available to the cache control.

The method 600 further includes determining if there is an error overflow at block 603. For example, according to the method 600, an overflow may be a situation where the number of line deletes for a particular row or for a particular EDRAM macro is above a predetermined or desired threshold. This may be determined using the information stored and referenced above. Absent an overflow, the method 600 includes issuing a line delete at block 604 and continuing normal cache operation at block 606.

If there is an overflow, the method 600 includes implementing a cache array mask for the row corresponding to the overflow of errors at block 605. For example, implementing the cache array mask may include setting a bit (e.g., to a logical "1") within a logical mask at a cache array mask register corresponding to the row. This bit in turn is passed within the logical mask to LRU selection logic within the cache memory control to render the corresponding row non-writable or un-pickable. For example, this may be logical disablement of the entire row originating the errors, while still allowing any information of the row to be read.

Upon implementation of the cache array mask for the row, the method 600 includes continuing normal cache operation at block 606.

Therefore, example embodiments of the present invention include dynamic methods of EDRAM macro disablement which EDRAM macro disablement during actual system use of a cache memory.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Figure 7:
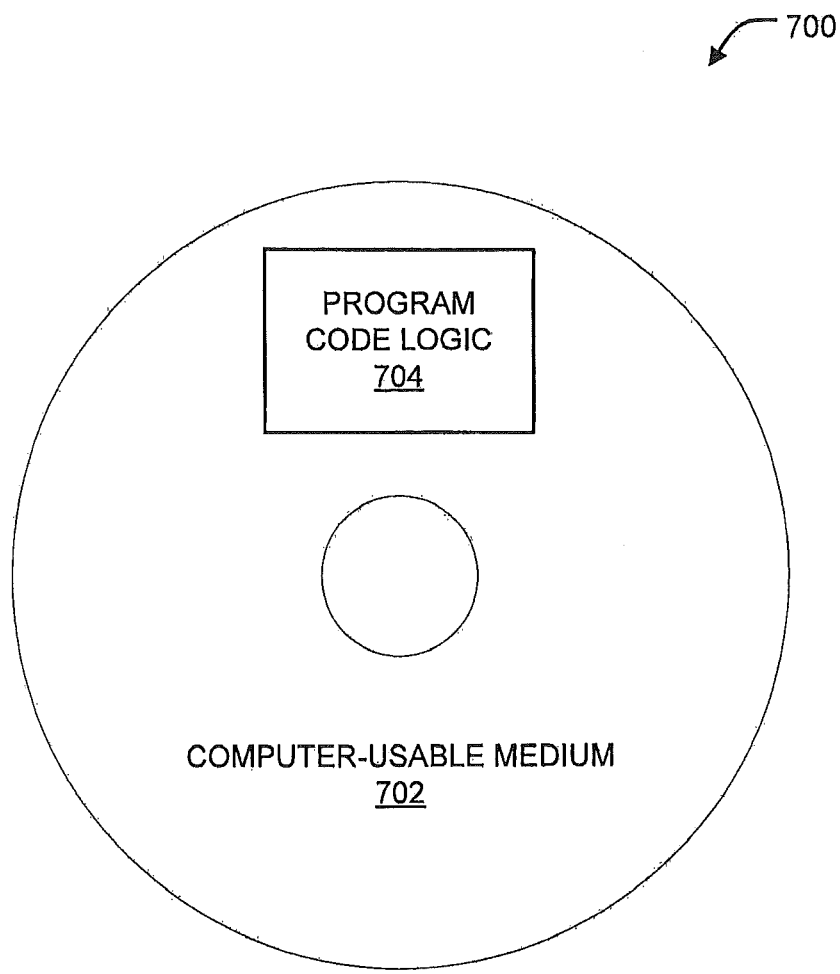
FIG. 7 depicts a computer program product.

As described above, embodiments can be embodied in the form of computer-implemented processes and apparatuses for practicing those processes. In exemplary embodiments, the invention is embodied in computer program code executed by one or more network elements. Embodiments include a computer program product 700 as depicted in FIG. 7 on a computer usable medium 702 with computer program code logic 704 containing instructions embodied in tangible media as an article of manufacture. Exemplary articles of manufacture for computer usable medium 702 may include floppy diskettes, CD-ROMs, hard drives, universal serial bus (USB) flash drives, or any other computer-readable storage medium, wherein, when the computer program code logic 704 is loaded into and executed by a computer, the computer becomes an apparatus for practicing the invention. Embodiments include computer program code logic 704, for example, whether stored in a storage medium, loaded into and/or executed by a computer, or transmitted over some transmission medium, such as over electrical wiring or cabling, through fiber optics, or via electromagnetic radiation, wherein, when the computer program code logic 704 is loaded into and executed by a computer, the computer becomes an apparatus for practicing the invention. When implemented on a general-purpose microprocessor, the computer program code logic 704 segments configure the microprocessor to create specific logic circuits.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention claimed is:

1. A computer implemented method of embedded dynamic random access memory (EDRAM) macro disablement, the method comprising:
   isolating an EDRAM macro of a cache memory bank, the cache memory bank being divided into at least three rows of a plurality of EDRAM macros, the EDRAM macro being associated with one of the at least three rows;
   iteratively testing each line of the EDRAM macro, the testing including attempting at least one write operation at each line of the EDRAM macro;
   determining that an error occurred during the testing; and
   disabling write operations for an entire row of EDRAM macros associated with the EDRAM macro based on the determining.

2. The method of claim 1, wherein the testing is an array built-in self-test (ABIST).

3. The method of claim 1, wherein further comprising:
   determining that an error overflow exists for the EDRAM macro; and
   activating a redundant circuit within the EDRAM macro based on the determining.

4. The method of claim 3, wherein the determining that an error overflow exists includes determining that the EDRAM macro includes available redundant circuits capable of circumventing the error within the EDRAM macro.

5. The method of claim 3, wherein the activating a redundant circuit within the EDRAM macro includes arranging circuit paths to circumvent the error inside the EDRAM macro.

6. The method of claim 1, wherein disabling write operations includes:
   creating a logical bit mask, the logical bit mask including one bit representing each row of EDRAM macros of the cache memory bank;
   setting a bit representing the row of EDRAM macros associated with the EDRAM macro within the logical bit mask;
   outputting the logical bit mask to least recently used (LRU) selection logic of the cache memory; and
   excluding a row of EDRAM macros represented by the bit from selection at the LRU selection logic.

* * * * *